(12) United States Patent
Chengalva et al.

(10) Patent No.: US 6,999,317 B2
(45) Date of Patent: Feb. 14, 2006

(54) THERMALLY ENHANCED ELECTRONIC MODULE WITH SELF-ALIGNING HEAT SINK

(75) Inventors: Suresh K. Chengalva, Kokomo, IN (US); Gary E. Oberlin, Windfall, IN (US); Matthew R. Walsh, Sharpsville, IN (US)

(73) Assignee: Delphi Technologies, Inc., Troy, MI (US)

( * ) Notice: Subject to any disclaimer, the term of this patent is extended or adjusted under 35 U.S.C. 154(b) by 218 days.

(21) Appl. No.: 10/639,572

(22) Filed: Aug. 12, 2003

(65) Prior Publication Data

US 2005/0036292 A1 Feb. 17, 2005

(51) Int. Cl.
*H05K 7/20* (2006.01)

(52) U.S. Cl. ............... 361/715; 361/704; 361/719; 165/185; 174/16.3; 257/712

(58) Field of Classification Search .......... 361/688, 361/706, 705–712, 715–719, 721–724; 257/706, 257/707, 717–726; 165/80.2, 80.3, 80.4, 165/185; 174/15.1, 16.3, 252
See application file for complete search history.

(56) References Cited

U.S. PATENT DOCUMENTS

| | | | | |
|---|---|---|---|---|
| 4,069,498 A | * | 1/1978 | Joshi | 257/713 |
| 4,246,597 A | * | 1/1981 | Cole et al. | 257/713 |
| 4,621,304 A | * | 11/1986 | Oogaki et al. | 361/720 |
| 4,887,147 A | * | 12/1989 | Friedman | 174/252 |
| 4,942,497 A | * | 7/1990 | Mine et al. | 361/702 |
| 5,309,979 A | | 5/1994 | Brauer | |
| 5,339,215 A | * | 8/1994 | Nishiguchi | 361/704 |
| 5,387,815 A | * | 2/1995 | Nishiguchi | 257/704 |
| 5,396,404 A | | 3/1995 | Murphy et al. | |
| 5,447,750 A | * | 9/1995 | Nishiguchi | 427/207.1 |
| 5,504,653 A | | 4/1996 | Murphy et al. | |
| 5,895,973 A | | 4/1999 | Fessenden | |
| 5,946,192 A | * | 8/1999 | Ishigami et al. | 361/704 |
| 5,999,407 A | * | 12/1999 | Meschter et al. | 361/704 |
| 6,156,980 A | | 12/2000 | Peugh et al. | |
| 6,385,044 B1 | * | 5/2002 | Colbert et al. | 361/700 |
| 6,404,638 B1 | * | 6/2002 | Messina | 361/715 |
| 6,639,798 B1 | | 10/2003 | Jeter et al. | |

FOREIGN PATENT DOCUMENTS

JP 410145064 A * 5/1998

OTHER PUBLICATIONS

Article: "Liquid Piston with Phase Change to Absorb Thermal Transients", IBM Technical Disclosure Bulletin, Oct. 1995, US vol. # 38, Issue # 10, p. # 69-70.*

(Continued)

*Primary Examiner*—Michael Datskovskiy
(74) *Attorney, Agent, or Firm*—Scott A. McBain

(57) ABSTRACT

A thermally enhanced electronic module includes a thermally conductive case, a self-aligning thermally conductive heat sink and an integrated circuit (IC) package. The case includes an aperture sized for receiving a portion of the heat sink. The IC package includes a first surface and a second surface, opposite the first surface, and is mounted to a substrate with the first surface of the IC package facing the substrate. The second surface of the IC package is in thermal contact with the heat sink, when the heat sink is positioned in the aperture and secured to the case.

9 Claims, 4 Drawing Sheets

OTHER PUBLICATIONS

Article: "Air Cooled Conduction Module", IBM Technical Disclosure Bulletin, Jul. 1978, US vol. # 21, Issue # 2, p. # 747-748.*

Article: "Design for Providing Thermal Interface material Narrow Thermal Interface Gaps", IBM Technical Disclosure Bulletin, Dec. 1977, US vol. # 20, Issue # 7, p. # 2761-2762.*

Article: "Gimbal Suspended Cooling Piston", IBM Technical Disclosure Bulletin, May 1981, US vol. # 23, Issue # 12, p. # 5489.*

* cited by examiner

THERMALLY ENHANCED ELECTRONIC MODULE WITH SELF-ALIGNING HEAT SINK

TECHNICAL FIELD

The present invention is generally directed an electronic module and, more specifically, to a thermally enhanced electronic module that includes a self-aligning heat sink.

BACKGROUND OF THE INVENTION

Various power devices, such as field effect transistors (FETs) and insulated gate bipolar transistors (IGBTs), require relatively efficient heat sinking to eliminate performance problems attributable to thermal limitations. Historically, these devices have been packaged in, for example, TO-220, DPAK or D²PAK type semiconductor packages, with the devices being mounted to a copper slug and then overmolded. Such semiconductor packages have then been mounted to a highly thermally conductive substrate or heat rail, which provides for one-sided heat sinking.

An alternative method has mounted a flip chip die directly to a substrate with a back of the die being coated with a thermal interface material to engage a fixed pedestal heat sink that is fabricated as part of a case. Dual-sided heat sinking in this manner generally reduced thermal resistance by an order of magnitude. In such a configuration, it is highly desirable to minimize the gap between the pedestal and the die as the thermal interface material positioned in the gap between the pedestal and the die has generally had significantly higher thermal resistance than the other components.

In one such electronic module, a relatively thin (0.031 inch) flexible laminate substrate was used to improve alignment of a die with a fixed pedestal heat sink. Due to the fact that the substrate had limited compliance, the force applied to solder joints of the die was frequently asymmetrical. This asymmetrical force has tended to increase the variability of solder joint reliability. Further, the variation in the gap between the die and the fixed pedestal heat sink has resulted in a variable thermal performance between similar assemblies. Additionally, utilizing a fixed pedestal heat sink limits the use of a rigid substrate and, thus, makes solder joints that attach a die to a substrate more vulnerable to cracking prior to underfill.

FIG. 1 depicts a partial cross-section of a typical prior art electronic module 10 that includes a case 12 having an upper half and a lower half. The upper half of the case 12 includes an integrated fixed pedestal heat sink 14, which is in thermal contact with a flip chip 16. As is shown, a thermal interface material 18 is located at the interface between the heat sink 14 and the flip chip 16. As shown, the flip chip 16 includes a number of contacts 20 that are soldered to traces 22 formed on a substrate 24. The substrate 24 is mounted to the upper portion of the case 12 via a standoff 27 and an elastomer 26 supports the substrate 24 and keeps the material 18 in compression to ensure thermal contact is maintained between the flip chip 16 and the heat sink 14. The module 10 requires relatively tight tolerances for flip chip 16 tilt and substrate 24 warpage and requires that the substrate 24 be relatively flexible to allow the flip chip 16 to align to the fixed pedestal heat sink 14, which places solder joints at risk to crack prior to stabilization. An underfill 28 stabilizes the flip chip 16. As previously discussed, due to uneven application of force to the flip chip 16, the reliability of the flip chip 16 is somewhat variable as asymmetrical loads on the solder joints of the flip chip 16 can result in failure of the solder joints.

What is needed is an improved technique for conducting heat away from an integrated circuit (IC) package.

SUMMARY OF THE INVENTION

An embodiment of the present invention is directed to a thermally enhanced electronic module that includes a thermally conductive case, a self-aligning thermally conductive heat sink and an integrated circuit (IC) package. The case includes an aperture sized for receiving a portion of the heat sink. The IC package includes a first surface and a second surface, opposite the first surface, and is mounted to a substrate with the first surface of the IC package facing the substrate. The second surface of the IC package is in thermal contact with the heat sink, when the heat sink is positioned in the aperture and secured to the case.

According to another embodiment of the present invention, a thermally conductive interface material is located between the IC package and the heat sink. According to yet another embodiment of the present invention, a thermally conductive adhesive seal is located between the case and the heat sink.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DESCRIPTION OF THE PREFERRED EMBODIMENTS

Figure 1:
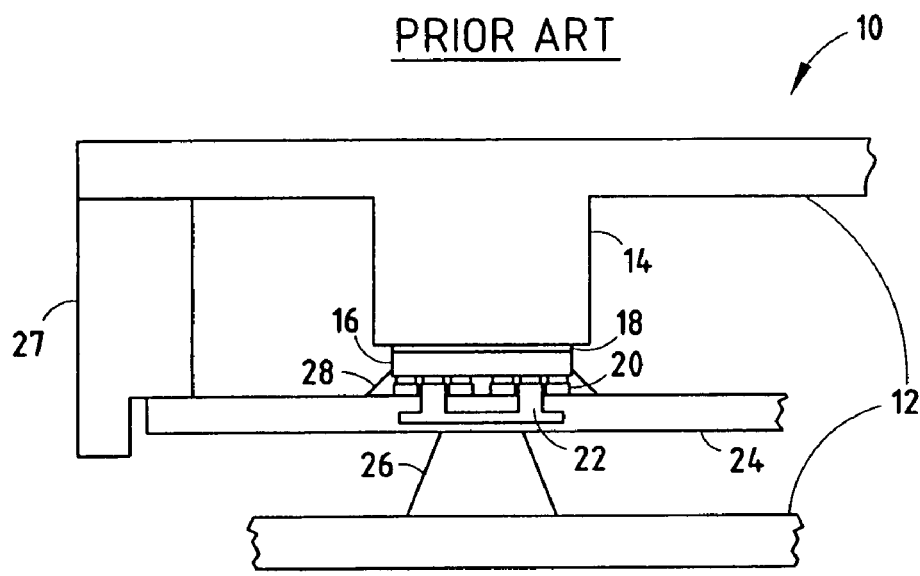
FIG. 1 is a partial cross-sectional view of an electronic module according to the prior art.

According to the present invention, a self-aligning pedestal heat sink that may be utilized for various integrated circuit (IC) packages, e.g., a semiconductor package and/or a bare die, is disclosed. Implementing such a self-aligning pedestal heat sink allows for the use of relatively rigid substrates, such as relatively thick (e.g., 0.062 inch) laminates, ceramics ($Al_2O_3$), aluminum nitride (AlN), silicon nitride ($Si_3N_4$) and low temperature cofired ceramics (LTCCs). Thus, implementing a self-aligning pedestal heat sink allows for relatively rigid substrates or components with more tilt than a compliant substrate can accommodate. This is especially advantageous when assemblies have warped substrates due to the reflow process and assembly techniques.

According to embodiments of the present invention, a self-aligning pedestal heat sink is positioned through an aperture formed through a surface of a case. The aperture allows for proper positioning of the heat sink with respect to an IC package to provide for a high quality thermal path with a relatively large surface area. Thermal conductivity can be enhanced through the application of a thermal interface material to fill the relatively small air gap between the IC package and the heat sink. It should be appreciated that the configuration of the case adjacent the aperture can be varied to increase thermal conductivity.

As previously mentioned, a self-aligning heat sink pedestal facilitates the use of rigid substrates, which can help to eliminate cracked solder bumps, due to substrate deflection, during the assembly process prior to underfill. Further, utilization of a self-aligning pedestal heat sink improves reliability by uniformly applying a contact load to the solder joints and accommodates packaged and high power devices with thick solder joints, which usually have more tilt and height variation. Such a self-aligning pedestal heat sink may be fabricated independently from the case out of materials that have superior thermal characteristics, which may serve to increase suppression of thermal transients that are typically localized on the IC package.

Further, self-aligning pedestal heat sinks may be fabricated more economically in situations where electrical isolation is required for the heat sink by applying a thin layer of non-conductive material, such as a sheet of silicon nitride ($Si_3N_4$) or a deposited diamond-like carbon (DLC) film. Further, in assemblies utilizing self-aligning heat sink pedestals, machining of pedestal surfaces, which was previously required to prevent mechanical damage to a bare die in assemblies employing fixed pedestal heat sinks, is not required. Finally, a self-aligning pedestal heat sink according to the present invention facilitates easier implementation and more economical packaging of assemblies whose IC packages vary in thickness and substrate warpage. That is, variations in IC package thickness and substrate warpage can be accommodated by the use of a thermally conductive material in the gap between the heat sink pedestal and the case.

A self-aligning pedestal heat sink is particularly advantageous when implemented in electronic modules that include devices, such as field effect transistors (FETs), insulated gate bipolar transistors (IGBTs), power flip chips and power packages. Such devices may be utilized in DC to AC converters, electronic power steering modules, electric vehicle (EV)/hybrid modules, power modules and injector driver modules. Electronic modules that include a self-aligning pedestal heat sink generally provide a higher level of system performance and eliminate line-pull and warranty returns for cracked solder joints generated during assembly. Assemblies incorporating self-aligning pedestal heat sinks may improve product life as solder joint loads are more distributed.

Figure 2:
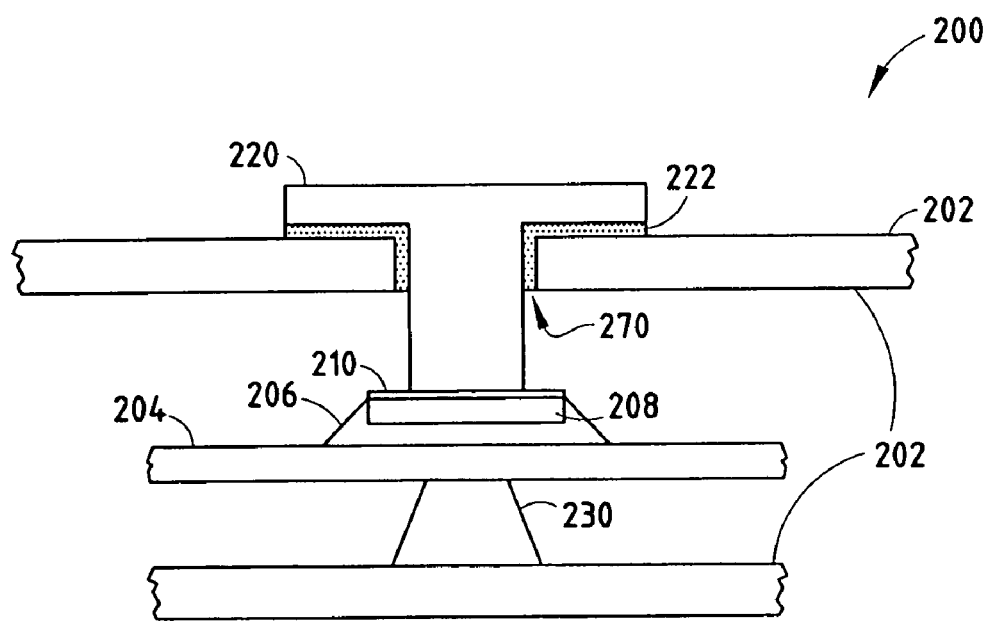
FIG. 2 is a partial cross-sectional view of an electronic module according to one embodiment of the present invention.

With reference to FIG. 2, a thermally enhanced electronic module 200, according to one embodiment of the present invention, is shown. As is shown, a case 202 encloses a substrate 204 onto which is mounted an IC package 208. Substrate 204 is supported on case 202 by a standoff 230. An underfill 206 is positioned around the IC package 208 to help prevent solder cracks. A heat sink 220 is positioned through an aperture 270 in the case 202 and is positioned to be in thermal contact with the IC package 208. A thermal interface material 210 may be positioned between the heat sink 220 and the IC package 208. When the heat sink 220 is properly positioned through the aperture 270, with respect to the IC package 208, an adhesive seal 222 (e.g., a thermally conductive adhesive seal) is used to attach the heat sink 220 to the case 202. It should be appreciated that the adhesive seal must be sufficiently thick to allow the pedestal to align itself properly with a top surface of the IC package 208.

Figure 3:
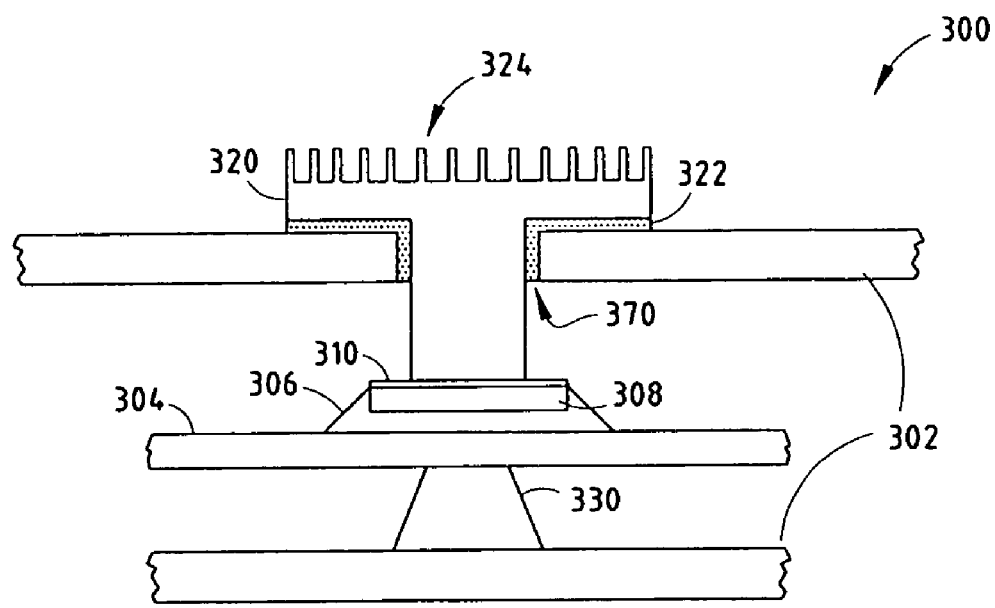
FIG. 3 is a partial cross-sectional view of an electronic module according to the another embodiment of the present invention.

FIG. 3 depicts a thermally enhanced electronic module 300, according to another embodiment of the present invention. Similar to the module 200 of FIG. 2, the module 300 includes a case 302 that includes an aperture 370 formed through a portion of the case. A substrate 304 is positioned on a standoff 330 with respect to a lower portion of the case 302. An underfill 306 is used to support the IC package 308 and a thermal interface material 310 is utilized to enhance heat transfer from the IC package 308 to the heat sink 320. As is shown in FIG. 3, the heat sink 320 includes a plurality of fins 324, which further act to convect heat away from the IC package 308. An adhesive seal 322 is utilized to attach the heat sink 320 to a top portion of the case 302, when the heat sink 320 is properly positioned, with respect to the IC package 308, within the aperture 370.

Figure 4:
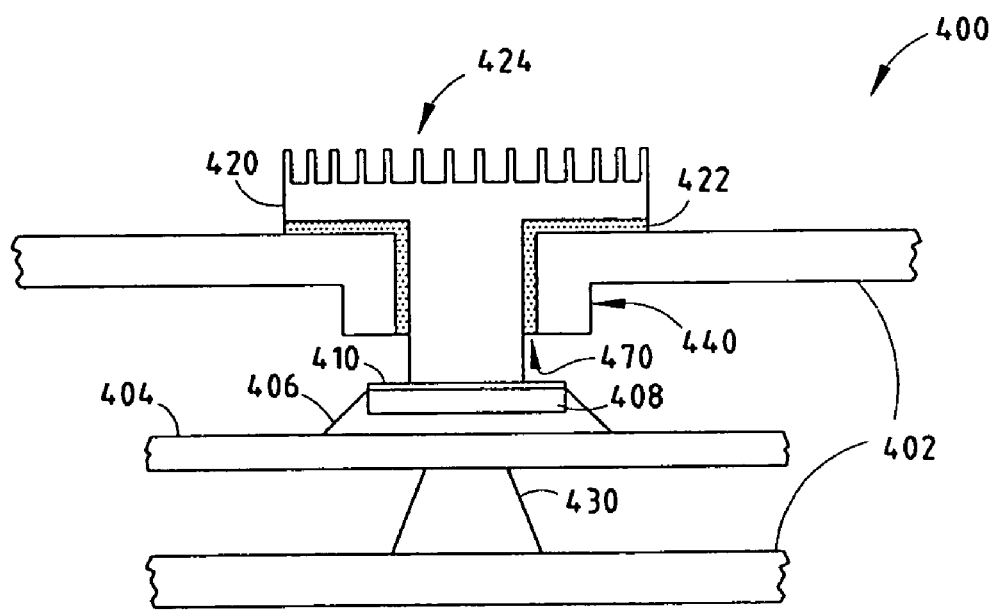
FIG. 4 is a partial cross-sectional view of an electronic module according to yet another embodiment of the present invention.

FIG. 4 depicts a thermally enhanced electronic module 400 that has a case 402 that is configured to increase the area of contact between the heat sink 420 and the case 402. As is shown, an inner portion 440 of the case 402 adjacent aperture 470 is elongated to increase the thermal contact area between the heat sink 420 and the case 402. As with the embodiments of FIGS. 2 and 3, a substrate 404 is positioned on a standoff 430 with respect to a lower portion of the case 402. An IC package 408 is mounted to the substrate 404 and an underfill 406 is utilized to prevent breakage of solder joints. A thermal interface 410 is positioned between a top surface of the IC package 408 and the heat sink 420. As is shown in FIG. 4, the heat sink 420 includes a plurality of fins 424 and an adhesive seal 422 is used to attach the heat sink 420 to a top portion of the case 402 when the heat sink 420 is properly positioned with respect to the IC package 408.

Figure 5:
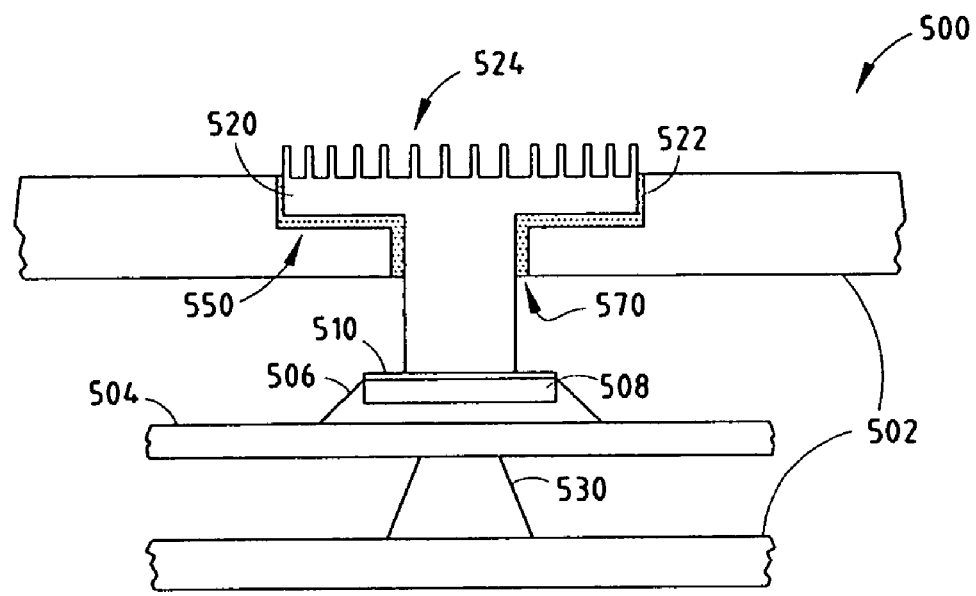
FIG. 5 is a partial cross-sectional view of an electronic module according to still another embodiment of the present invention.

FIG. 5 depicts a thermally enhanced electronic module 500 according to yet another embodiment of the present invention. Similar to the embodiments of FIGS. 2–4, the module 500 includes a substrate 504 positioned on a standoff 530 within a case 502. An IC package 508 is mounted and electrically connected to the substrate 504. An underfill 506 is utilized to prevent cracks in the solder joints that attach the IC package 508 to the substrate 504. A thermal interface 510 is positioned between a top surface of the IC package 508 and a heat sink 520. The heat sink 520 includes a plurality of fins 524 and a top portion of the case 520, adjacent the aperture 570, includes a recess 550 for receiving the heat sink 520. The recess 550 generally increases the surface area contact between the heat sink 520 and the case 502. An adhesive seal 522 maintains the heat sink 520 in proper relationship to the IC package 508 and attaches the heat sink 520 to the case 502.

Figure 6:
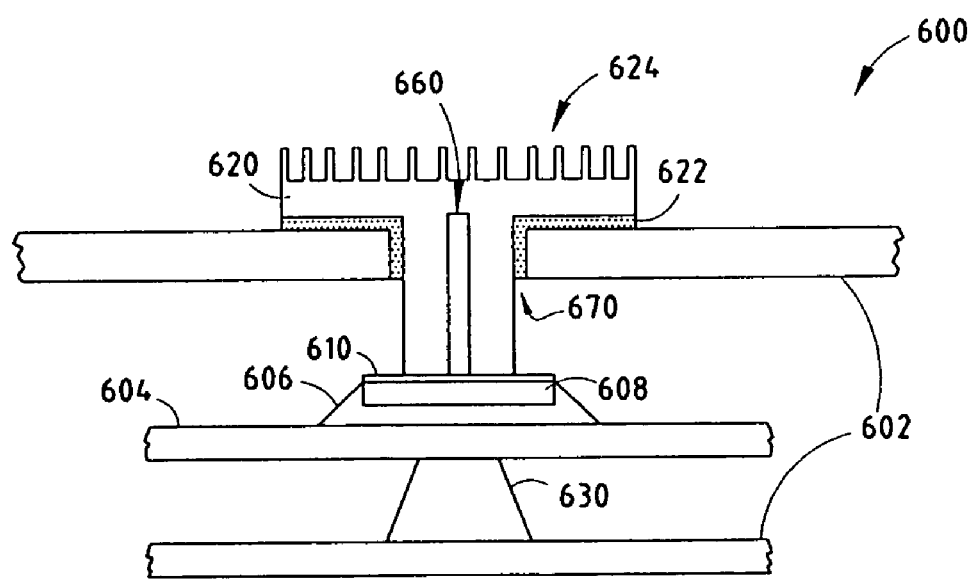
FIG. 6 is a partial cross-sectional view of an electronic module according to a different embodiment of the present invention.

FIG. 6 depicts a thermally enhanced electronic module 600 according to another embodiment of the present invention, with a heat sink 620, including a heat pipe 660 and a plurality of fins 624. As with the embodiments of FIGS. 2–5, an aperture 670 is formed through a top surface of a case 602 and a substrate 604 is positioned on a standoff 630 in proper relationship to a lower portion of the case 602. An IC package 608 is electrically coupled to the substrate 604 and an underfill 606, which is positioned around and underneath the IC package 608, is utilized to prevent solder cracks. The heat pipe 660 can aid in the removal of heat from the IC package 608 and may be especially useful in high power applications.

Figure 7:
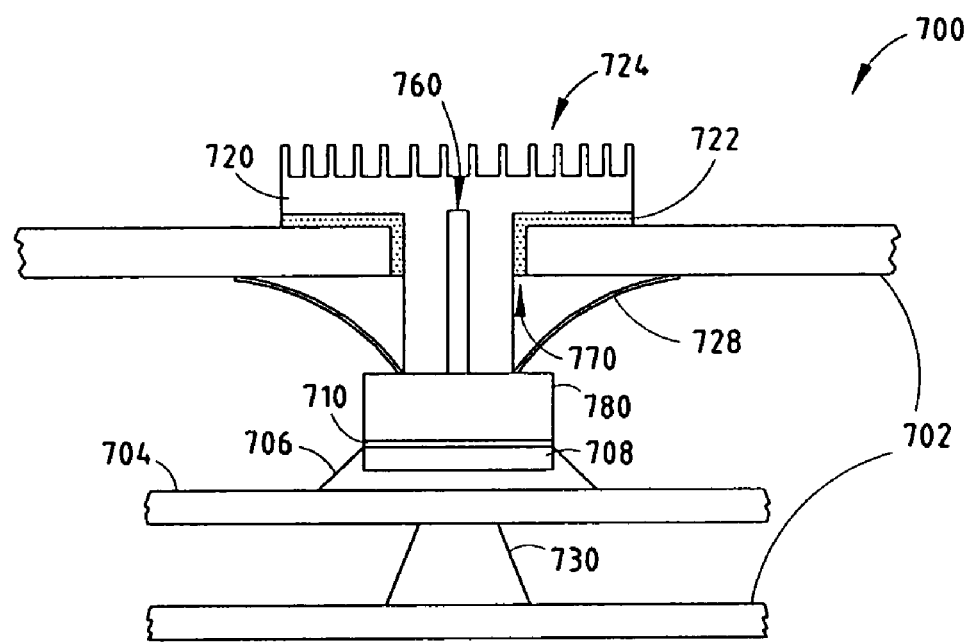
FIG. 7 is a partial cross-sectional view of an electronic module according to yet another different embodiment of the present invention.

FIG. 7 depicts a thermally enhanced electronic module 700 according to yet another embodiment of the present invention. The module 700 may include a substrate 704 positioned, on an elastomeric standoff 730 with respect to a lower portion of a case 702. An IC package 708 is mounted and electrically coupled to the substrate 704 and an underfill 706 is utilized to prevent solder cracks. A thermal interface material 710 is positioned between a cap 780 and the IC package 708. A spring with a plurality of fingers 728, is positioned between the cap 780 and the case 702. Alternately, a coil spring may be provided. The spring presses the cap 780 substantially flat against the IC package 708. A heat sink 720, which includes a plurality of fins 724 and a heat pipe 760, is positioned through the aperture 770 in a top portion of the case 702 and a seal 722 attaches the heat sink 720 to the top portion of the case 702.

Figure 8:
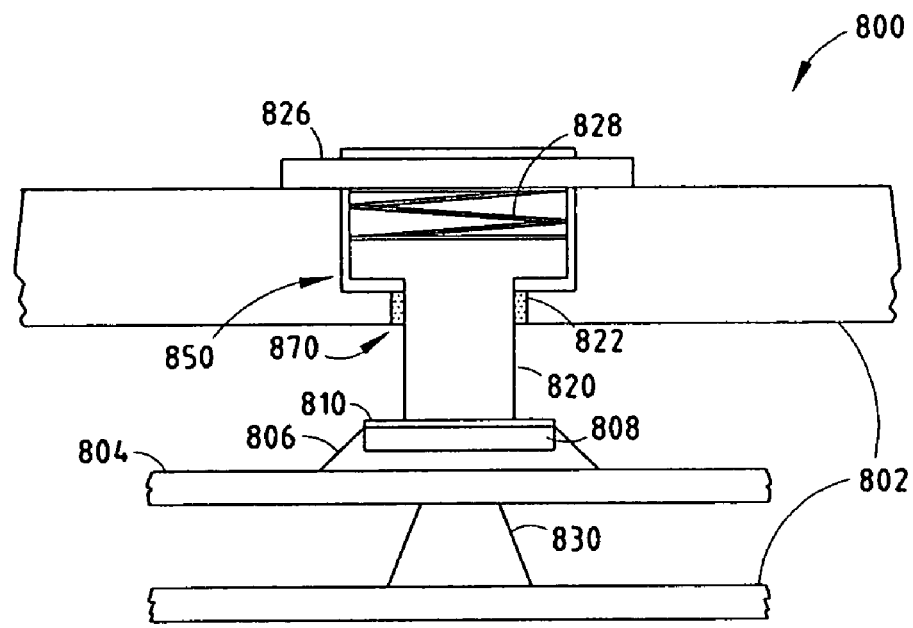
FIG. 8 is a partial cross-sectional view of an electronic module according to still another embodiment of the present invention.

With reference to FIG. 8, a thermally enhanced electronic module 800, according to another embodiment of the present invention, is depicted. The module 800 is similar to the embodiments of FIGS. 2–7, in that it includes an aperture 870 and a substrate 804 positioned with respect to a lower portion of a case 802 by a standoff 830. An IC package 808 is electrically coupled to the substrate 804 and an underfill 806 supports the IC package to prevent solder cracks. A thermal interface material 810 is positioned between the IC package 808 and heat sink 820, which is positioned through the aperture 870 and within a recess 850 formed in the top portion of the case 802. A spring 828 is positioned between a top surface of the heat sink 820 and a retaining plate 826, which is attached to a top portion of the case 802. A seal 822 is positioned between the case 802 and the heat sink 820 in the area of the aperture 870.

Accordingly, a number of thermally enhanced electronic modules that include self-aligning pedestal heat sinks have been described herein. Such electronic modules can utilize relatively rigid substrates and/or allows for components with more tilt than a compliant substrate can accommodate and can be broadly implemented within a variety of environments and applications. Thermally enhanced electronic modules with a self-aligning thermally conductive heat sink are especially advantageous when implemented within an automotive environment. For example, such modules may be implemented as DC to AC converters, electronic power steering modules, EV/hybrid modules, power modules and injector modules.

What is claimed is:

1. A thermally enhanced electronic module, comprising:
   a thermally conductive case having an aperture and an exterior surface having a recess adjacent said aperture;
   a self-aligning thermally conductive heat sink comprising an elongated portion extending through the aperture and a head portion overlying the exterior surface of the case;
   an integrated circuit (IC) package with a first surface and a second surface opposite the first surface, wherein the IC package is mounted to a substrate with the first surface of the IC package facing the substrate, and wherein the second surface of the IC package is in thermal contact with the elongated portion of the heat sink; and
   a thermally conductive adhesive seal located between the case at the aperture and the elongated portion of the heat sink and between the head portion of the heat sink and the exterior surface of the recess.

2. The module of claim 1, wherein the substrate is one of a laminate substrate, a ceramic substrate, an aluminum nitride substrate, a silicon nitride substrate, a low temperature co-fired ceramic substrate and a printed circuit board (PCB).

3. The module of claim 1, wherein the head portion includes a plurality of fins.

4. The module of claim 1, wherein an inner portion of the case that is adjacent the aperture is elongated to increase a thermal contact area between the heat sink and the case.

5. The module of claim 1, wherein an external portion of the case includes a recess adjacent the aperture to increase a thermal contact area between the heat sink and the case.

6. The module of claim 3, wherein a central portion of the heat sink includes a heat pipe to facilitate heat transfer away from the IC package.

7. The module of claim 3, further including:
   a cap having a first surface in thermal contact with the IC package and a second surface opposite the first surface in thermal contact with the heat sink; and
   a spring assembly engaging the case about the aperture and pressing the cap toward the IC package to maintain the first surface of the cap in thermal contact with the IC package.

8. A method for manufacturing a thermally enhanced electronic module, comprising the steps of:
   forming an aperture through a surface of a thermally conductive case and a recess in this surface adjacent said aperture;
   positioning a substrate including an integrated circuit (IC) package within the thermally conductive case, wherein the IC package includes a first surface and a second surface opposite the first surface, and wherein the IC package is mounted to the substrate with the first surface of the IC package facing the substrate;
   positioning a self-aligning thermally conductive heat sink having an elongated portion extending through the aperture in thermal contact with the second surface of the IC package and a head portion overlying an exterior surface of the recess; and
   forming a thermally conductive adhesive seal to secure the heat sink to the case, said seal extending between the elongated portion of the heat sink and the case at said aperture and between the head of the heat sink and the exterior surface of the case.

9. A thermally enhanced electronic module, comprising:
   a thermally conductive case;
   a self-aligning thermally conductive heat sink, wherein the case includes an aperture sized for receiving a portion of the heat sink;
   an integrated circuit (IC) package with a first surface and a second surface opposite the first surface, wherein the IC package is mounted to a substrate with the first surface of the IC package facing the substrate, and wherein the second surface of the IC package is in thermal contact with the heat sink when the heat sink is positioned in the aperture and secured to the case, and the substrate is positioned within the case;
   a thermally conductive adhesive seal located between the case and the heat sink;
   a retaining plate; and
   a spring positioned within a recess and between the retaining plate and the heat sink, and wherein the spring assembly is configured to maintain the heat sink in thermal contact with the IC package.

* * * * *